United States Patent
Yalamanchili et al.

(10) Patent No.: US 12,006,564 B2
(45) Date of Patent: Jun. 11, 2024

(54) CUBIC Al-RICH AlTiN COATINGS DEPOSITED FROM CERAMIC TARGETS

(71) Applicants: Oerlikon Surface Solutions AG, Pfäffikon, Pfäffikon (CH); MOLDINO Tool Engineering, Ltd., Tokyo (JP)

(72) Inventors: Siva Phani Kumar Yalamanchili, Sargans (CH); Denis Kurapov, Walenstadt (CH); Tomoya Sasaki, Yasu (JP); Kazuyuki Kubota, Yasu (JP)

(73) Assignees: Oerlikon Surface Solutions AG, Pfäffikon, Pfäffikon (CH); MOLDINO Tool Engineering, Ltd., Tokyo (JP)

( * ) Notice: Subject to any disclaimer, the term of this patent is extended or adjusted under 35 U.S.C. 154(b) by 325 days.

(21) Appl. No.: 17/291,841

(22) PCT Filed: Nov. 11, 2019

(86) PCT No.: PCT/EP2019/080809
§ 371 (c)(1),
(2) Date: May 6, 2021

(87) PCT Pub. No.: WO2020/094882
PCT Pub. Date: May 14, 2020

(65) Prior Publication Data
US 2021/0395875 A1  Dec. 23, 2021

Related U.S. Application Data

(60) Provisional application No. 62/757,954, filed on Nov. 9, 2018.

(51) Int. Cl.
*C23C 14/06* (2006.01)
*C23C 14/34* (2006.01)

(52) U.S. Cl.
CPC ........ *C23C 14/0617* (2013.01); *C23C 14/345* (2013.01)

(58) Field of Classification Search
CPC ........... C23C 14/0617; C23C 14/0641; C23C 14/345
See application file for complete search history.

(56) References Cited

U.S. PATENT DOCUMENTS 8,409,696 B2  4/2013  Johansson et al.
8,741,011 B2  6/2014  Johansson et al.

FOREIGN PATENT DOCUMENTS

CN  101952482 A  1/2011
CN  102378831 A  3/2012
(Continued)

OTHER PUBLICATIONS

Translation to Kim (WO 2014/109425) published Jul. 2014.*
(Continued)

*Primary Examiner* — John J Brayton
(74) *Attorney, Agent, or Firm* — Peter W. Schroen; Bret E. Field; Bozicevic, Field & Francis LLP

(57) ABSTRACT

The present invention discloses a non-reactive PVD coating process for producing an aluminium-rich $Al_xTi_{1-x}N$-based thin film having an aluminium content of >75 at-% based on the total amount of aluminium and titanium in the thin film, a cubic crystal structure, and a columnar microstructure, wherein ceramic targets are used as a material source for the aluminium-rich $Al_xTi_{1-x}N$-based thin film.

13 Claims, 10 Drawing Sheets

(56) References Cited

FOREIGN PATENT DOCUMENTS

| CN | 106929799 A | | 7/2017 | |
| JP | 11216601 A | * | 8/1999 | ......... C23C 14/0641 |
| JP | 2016223012 A | * | 12/2016 | |
| JP | 2018-034222 A | | 3/2018 | |
| WO | WO 2014/109425 | * | 7/2014 | |
| WO | WO2019048507 A1 | | 3/2019 | |

OTHER PUBLICATIONS

Endler et al., Novel aluminum-rich Ti1—xAlxN coatings by LPCVD, Surface & Coatings Technology, 2008, 203, 5-7, 530-533.

Park et al., Temperature coefficient of resistivity of TiAlN films deposited by radio frequency magnetron sputtering, vol. 23, Issue 2, Feb. 2013, pp. 433-438.

Office Action for India Application No. 202127020719 mailed on Nov. 11, 2022, with its English summary, 6 pages.

Office Action for Chinese Application No. 201980088086.9 mailed on Feb. 18, 2023, with its English translation, 16 pages.

Office Action for Chinese Application No. 201980088086.9 mailed on Jul. 22, 2023, with its English translation, 7 pages.

International Preliminary Report on Patentability for PCT Application No. PCT/EP2019/080809 mailed May 11, 2021, 11 pages.

Office Action for China Application No. 201980088086.9 mailed on Nov. 22, 2023, with its English Translation, 9 pages.

Notice of Deficiencies for Israel Application No. 282907 mailed on Nov. 29, 2023, 4 pages.

Notification of Reasons for Refusal for Japan Application No. 2021-525266 mailed on Dec. 5, 2023, with its English Translation, 5 pages.

Office Action for European Patent Application No. 19 805 107.0, dated Jan. 31, 2024, 8 pages.

* cited by examiner

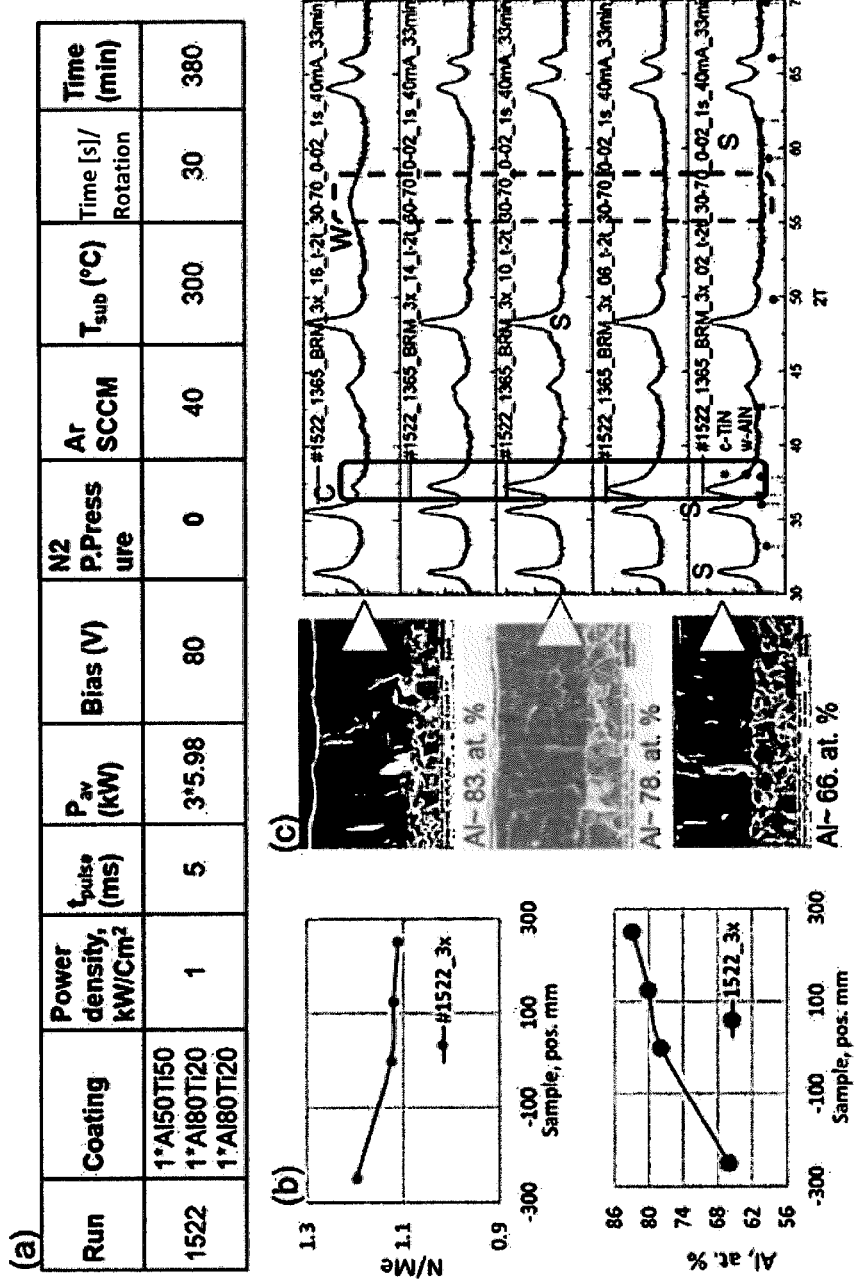
Fig. 5.1

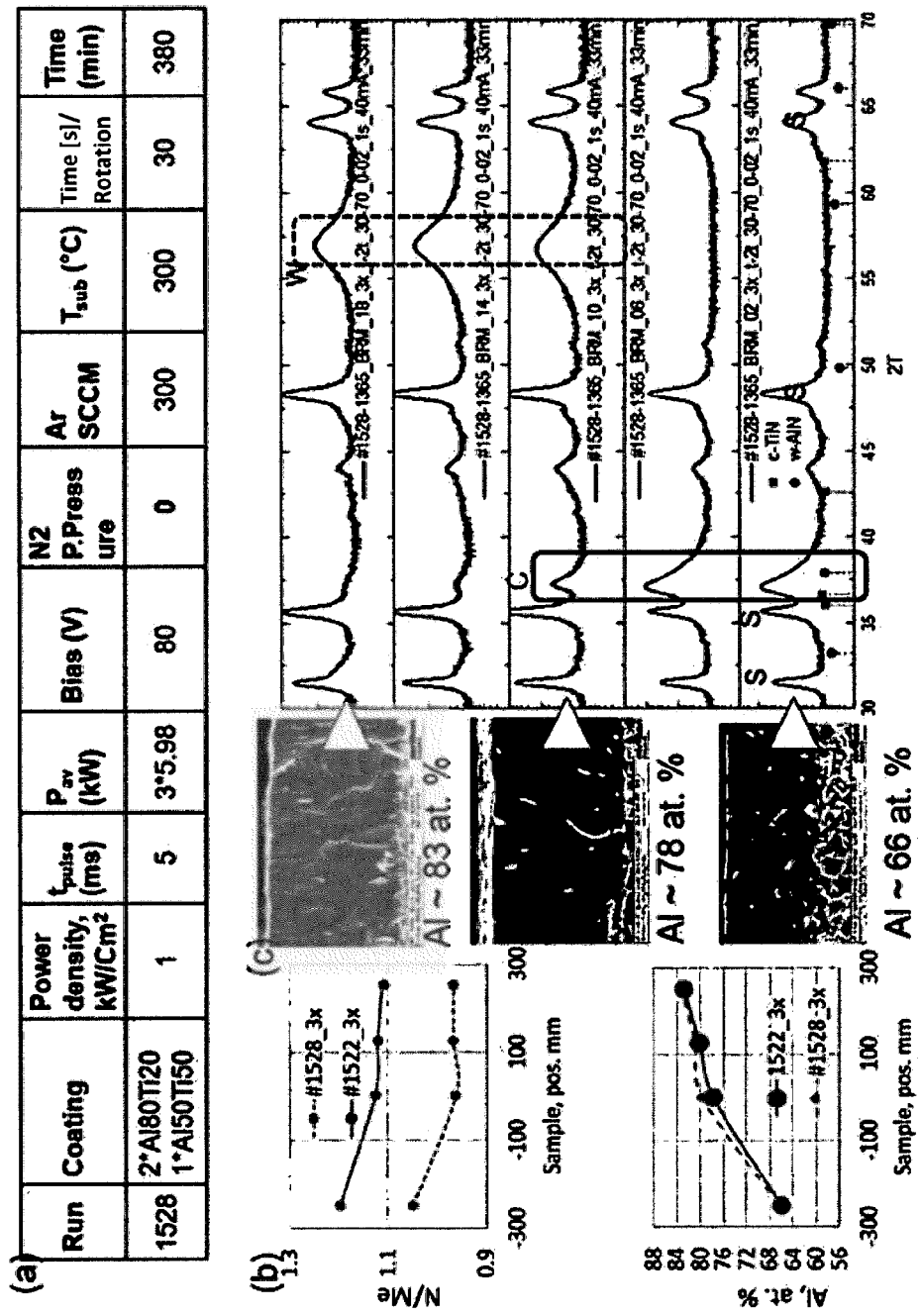
Fig. 5.2

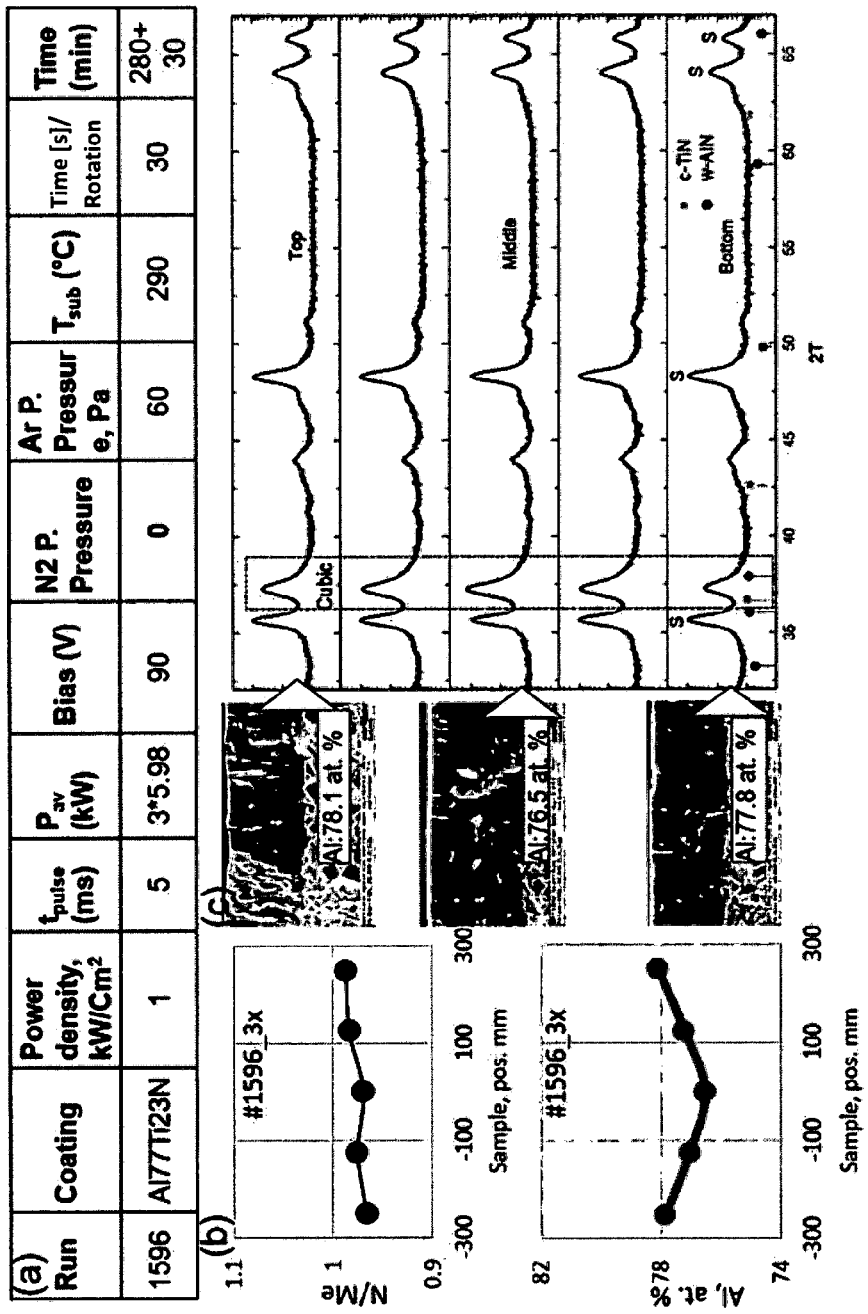
Fig. 5.3

CUBIC Al-RICH AlTiN COATINGS DEPOSITED FROM CERAMIC TARGETS

The present invention relates to the deposition of Al-rich $Al_xTi_{1-x}N$ coatings having Al content x>0.75 (in atomic percentage fraction) and exhibiting cubic phase with columnar structure, wherein ceramic targets are used as material source for the coating deposition.

The present invention allows using PVD methods for synthesizing Al-rich AlTiN coatings having Al content above 75 at.-% and even above 78 at.-% (considering the sum of the Al-content and Ti-content as 100%; consequently, when indicating for example a content of Al in the $Al_xTi_{1-x}N$ coating layer of 80 at.-%, it means x=0.80) and exhibiting columnar micro-structures in a reliable manner.

STATE OF THE ART

Currently available Al-rich AlTiN coatings (of the type thin films) having Al content above 75 at.-%, exhibiting a cubic crystal structure and a columnar micro-structure can be synthesized by LP-CVD processes as already known. These kinds of coatings have received considerable attention as they are expected to show superior wear protection compared to coatings with lower Al-content, such as $Al_{0.67}Ti_{0.33}N$ coatings. This superiority is expected for cutting tools, forming tools, and components in a wide range of applications.

The term thin film in the context of the present invention should be understood as referring to coatings or coating layers having a thickness ranging from nanometers to several micrometers.

The term Al-rich AlTiN in the context of the present invention should be understood as referring to AlTiN coatings or coating layers comprising aluminium in a higher amount as titanium. In particular this invention referrers then to Al-rich AlTiN coatings or coating layers having ratio of Al/Ti (content of Al in atomic percentage/Ti-content in atomic percentage) larger than 3.

Historically, it was known that using PVD methods metastable cubic phase could be grown with a maximum of 70 at.-% Al in AlTiN films.

EP 2 247 772 B1 discloses a multilayered structure comprising two different kinds of layers deposited alternate one of each other, more exactly comprising cubic structured $(Ti_{1-x}Al_x)N$-layers, where 0.3<x<0.95, and cubic structured MeN layers, where Me is one or more of the metal elements Ti, Zr, Hf, V, Nb, Ta, Mo and Al. However, according to EP 2 247 772 B1, the thickness of the $(Ti_{1-x}Al_x)N$-layers comprised in the multilayered structure is less than 20 nm.

EP 2 926 930 B1 discloses a method to deposit hard coating layer of $(Al_xTi_{1-x})N$ (0.5≤x≤0.8) but the $(Al_xTi_{1-x})N$ coating layer comprising both cubic and hexagonal phases.

U.S. Pat. No. 10,184,187 B2 discloses a method for the production of $(M_{1-x}Al_xN)$-layers, where x is 0.7-0.85 but comprising wurtzite phase, where the content of wurtzite phase is between 1 and 35 wt.-% (in weight percentage).

Furthermore, WO 2019/048507 A1 discloses a method to grow cubic Al-rich AlTiN. Herein, the inventors have experimented the possibility of synthesizing Al-rich AlTiN with Al content above 75 at. % by using reactive PVD processes, in which a HiPIMS technology is used by adjusting a predetermined set of process parameters in specific ranges. These process parameters include for example power density and pulse length. According to the reactive PVD process mentioned in WO 2019/048507 A1 a very important parameter is the $N_2$ partial pressure. It has been shown that cubic phase is formed only within a very narrow range of values of $N_2$ partial pressure. If the $N_2$ pressure is lower or higher than the values within this specific range, then a hexagonal phase is formed, which is undesirable. This makes the process complicated, as the optimal partial pressure must always be calibrated for each particular target being used, and also depending on the target weight or thicknesses. It means the required $N_2$ consumption and consequently the required $N_2$ partial pressure for producing the desired coating will vary depending on the target life. Furthermore, a high (in absolute value) negative substrate bias is required to form the cubic phase (e.g. >120V) for producing $Al_{80}Ti_{20}N$. The use of such high bias voltage values causes that the films grow exhibiting very high internal stresses (if deposited by PVD normally inherent compressive stresses), which can cause flaking of the coatings, specially by increased coating thickness.

The use of ceramic targets is avoided because their use is known to result in cracking due to their inherent brittle nature combined with repetitive thermal cycling affecting the targets during evaporation of target material by using sputtering or arc discharge processes. The cracked targets cannot be used for arc discharge processes as the arc will run through the crack and causes damage of deposition chamber components. Likewise, the cracked targets cannot be used for sputtering processes in properly manner.

OBJECTIVE OF THE PRESENT INVENTION

It is an object of the present invention to alleviate or to overcome one or more difficulties related to the prior art. In particular, it is an object of the present invention to provide a PVD coating process that enables the production of aluminium-rich thin films of a structure of the form $(Al_xTi_{1-x})N$ in cubic phase in a simple, reliable and environmental friendly manner.

DESCRIPTION OF THE PRESENT INVENTION

The inventors have decided do not to use any typical reactive PVD process, in which metallic AlTi-targets are evaporated or sputtered in a reactive $N_2$-containing atmosphere but using a non-reactive PVD process, in which ceramic AlTiN targets are sputtered or evaporated without needing any reactive gas within the coating chamber.

Thus, in a first aspect of the present invention disclosed is a non-reactive PVD coating process for producing an aluminium-rich $Al_xTi_{1-x}N$-based thin film having an aluminium content of >75 at-% based on the total amount of aluminium and titanium in the thin film, a cubic crystal structure, and a columnar microstructure, wherein ceramic targets are used as a material source for the aluminium-rich $Al_xTi_{1-x}N$-based thin film.

By using this inventive configuration, it was surprisingly possible to produce Al-rich AlTiN films growing in cubic phase but by having a broader window of parameters and consequently a much broader working range of parameters, including much lower substrate bias than when using reactive processes with metallic target and $N_2$ as reactive gas.

A cubic crystal structure and a columnar microstructure according to the invention means preferably a solely cubic structure and a solely columnar microstructure. However, this does not mean that traces or small amounts of preferably less than 1 at-% relative to the total mass of aluminium and titanium in the thin film may also have a different phase or structure. The invention further defines a non-reactive coating process preferably as a coating process in which a bias voltage of less than 120 V is applied to the substrate to prevent cracking (in this regard the term "cracking" is used for referring to flaking or delamination of the coating).

The present invention involves also the use of ceramic targets comprising further elements for producing AlTiN coatings (AlTiN thin films) containing further elements or components. Thus, in an example of the first aspect, the ceramic target can also comprise other components next to nitrides, for example oxides, carbides, silicides or borides.

In another example of the first aspect, a negative bias voltage is applied to the substrate to be coated, wherein the bias voltage applied to the substrate is <120 V, preferably <100 V, in particular <80 V.

In another example of the first aspect, the ceramic targets comprise Al and Ti, wherein the aluminium content, based on the total amount of aluminium and titanium in the target is higher than 50 at-%.

In another example of the first aspect, the coating is carried out without reactive gas. Since the process according to the present invention does not need the introduction of any $N_2$ gas flow in the coating chamber, the process is very stable and relatively simple with a broader working range of parameters.

In another example of the first aspect, $AlN_{80}TiN_{20}$ is used as target material for the aluminium-rich $Al_xTi_{1-x}N$-based thin film. According to this example a stable discharge was obtained in spite of the fact that the fraction of AlN phase was major and it has semi-conduction properties. Additionally, it was possible to produce growth of the coatings in cubic form at lower substrate bias, for example by using a bias voltage of −80 V it was possible to produce $Al_xTi_{1-x}N$ with Al-content up to x=0.78. Surprisingly, the intrinsic stress in such coatings was considerably lower than by using the reactive PVD method. Despite ceramic targets being known to suffering cracking during sputtering and arc discharge process because of their inherent brittle nature combined with repetitive thermal cycling, it was surprisingly possible to carry out the inventive processes without target cracking by using targets with high AlN-content (higher than 50 at %). In particular, ceramic targets with composition $AlN_{80}TiN_{20}$, in contrast to targets with ceramic targets with composition $AlN_{50}TiN_{50}$ does not produce cracks and allows carrying out of stable and reproducible coating processes. In other words, is was possible to suppress cracks by using higher AlN contents in the AlNTiN targets, in particular very good results (no cracks) were observed by using $AlN_{80}TiN_{20}$ ceramic targets.

In another example of the first aspect, a sputtering technique, in particular a HiPIMS or an ARC PVD coating process is used as a non-reactive PVD coating process. In particular, the above-mentioned cracks suppression (e.g. by using ceramic targets of AlNTiN having AlN content higher than TiN, for example $AlN_{80}TiN_{20}$) makes possible to use ARC PVD techniques for the coating deposition of the inventive coatings from ceramic targets.

In another example of the first aspect, the ceramic targets comprise also other elements, for example other metallic elements apart from Al and Ti, preferably any other transition-metals, more preferably Zr and/or Nb and/or Ta.

In another example of the first aspect, a plurality of aluminium-rich $Al_xTi_{1-x}N$-based thin films are deposited one above the other to produce a multilayer thin film.

In another example of the first aspect, the substrate temperature is between 100° C. and 350° C., preferably between 150° C. and 250° C., in particular between 200° C. and 250° C.

In a second aspect, an aluminium-rich $Al_xTi_{1-x}N$-based thin film having an aluminium content of >75 at-% based on the total amount of aluminium and titanium in the thin film, a cubic crystal structure and a columnar microstructure, producible by a process mentioned previously is disclosed.

In another example of the second aspect, the thickness of the aluminium-rich $Al_xTi_{1-x}N$-based thin film is 200 nm, preferably ≥300 nm, in particular ≥500 nm.

According to a preferred embodiment of the present invention, the thickness of the aluminium-rich $Al_xTi_{1-x}N$-based thin film is between 0.5 μm and 20 μm.

An aluminium-rich AlxTi1−xN-based thin film in the context of the present invention should be understood as a coating comprising at least one Al-rich $Al_xTi_{1-x}N$ coating layer with x>0.75, or a coating comprising at least one layer comprising largely $Al_xTi_{1-x}N$ with x>0.75, where in both cases the thickness of the at least one layer mentioned above is preferably 200 nm or larger. Furthermore, the aluminium-rich AlxTi1−xN-based thin film can be formed by one layer, being a monolayer or can be formed by more than one layer, being a multilayer.

In another example of the second aspect, the thin film has a surface roughness $R_z$ of <0.8 μm, preferably <0.7 μm.

In another example of the second aspect, the cubic structure comprises crystallite grains with an average grain size of more than 15 nm.

In another example of the second aspect, the aluminium-rich $Al_xTi_{1-x}N$-based thin film has an aluminium content of >76 at-%, preferably >80 at-%, more preferably >85 at-% based on the total amount of aluminium and titanium in the thin film.

In another example of the second aspect, the aluminium-rich $Al_xTi_{1-x}N$-based thin film comprises other metallic elements in addition to aluminium and titanium, preferably transition-metals, more preferably Zr and/or Nb and/or Ta.

In another example of the second aspect, the thin film is formed in the form of a multilayer layer structure comprising at least two aluminium-rich $Al_xTi_{1-x}N$-based thin films deposited on each other.

In a third aspect a use of a structure mentioned before for manufacturing a tool, especially a cutting tool or a forming tool is disclosed. The above description should not be considered as a limitation of the present invention but only as examples for understanding the present invention in more detail.

DETAILED DESCRIPTION

FIG. 1 shows a schematic illustration of the fraction of w-AlN, $N_2$ consumption (growth rate/unit time) variation as a function of $N_2$ partial pressure (a) and an XRD spectrum at different $N_2$ partial pressures (b), FIG. 2 shows a schematic illustration of the fraction of w-AlN as a function of substrate bias voltage (a) and an XRD spectrum of AlTiN coatings synthesized from $Al_{80}Ti_{20}$ target at different substrate bias (b), FIG. 3 shows a schematic drawing of a combinatorial deposition set-up used to grow films from the ceramic targets, FIG. 4 shows an optical photograph and SEM micrograph of ceramic targets of TiNAlN, FIG. 5.1 shows films grown with combinatorial approach using ceramic targets, FIG. 5.2 shows films grown with combinatorial approach using ceramic targets, FIG. 5.3 shows films grown using ceramic targets, FIG. 6 shows films grown with metallic and ceramic targets, FIG. 7 shows films grown using $AlN_{77}TiN_{23}$ targets.

The following figures are intended to be helpfully for understanding the present invention but not for limiting the present invention:

FIG. 1 shows the influence of $N_2$ partial pressure on structural evolution of AlTiN coatings synthesized from $Al_{80}Ti_{20}$ metallic target at substrate temperature of 200° C. and Ar partial pressure of 0.2 Pa. (a) Fraction of w-AlN, $N_2$ consumption (growth rate/unit time) variation as a function of $N_2$ partial pressure. Annoted text indicate partial pressure of reactive gas corresponding to metallic, transition and compound sputtering mode. (b) XRD spectrum at different $N_2$ partial pressures of 0.09, 0.11, 0.13, and 0.15 Pa and corresponds to 1, 2, 3, and 4 consecutively.

FIG. 2 shows the influence of substrate bias on structural evolution of AlTiN alloy using metallic target. (a) fraction of w-AlN as a function of substrate bias voltage. Data extracted from xrd spectrum (F w-AlN: Intensity of wurtzite phase/Σ (intensity of cubic phase+intensity of wurtzite phase). (b) XRD spectrum of AlTiN coatings synthesized from Al80Ti20 target at different substrate bias of 80 V, 120 V, and 200 V.

FIG. 5.1 shows films grown with combinatorial approach using ceramic targets. (a) Batch parameters, (b) Composition of the films at different position of the substrate holder, and (c) X-SEM micro graph and XRD plot. Annotations: S→Substrate peaks, C→Cubic peak, W→Wurtzite phase. As shown in FIG. 5.1 the following coating parameter have been used: power density: 1 kW/cm², pulse time: 5 ms, nitrogen partial pressure: 0 Pa (which corresponds to a nitrogen gas flow of 0 sccm) and argon gas flow: 40 sccm.

FIG. 5.2 shows films grown with combinatorial approach using ceramic targets. (a) Batch parameters, (b) Composition of the films at different position of the substrate holder, and (c) X-SEM micro graph and XRD plot. Annotations: S→Substrate peaks, C→Cubic peak, W→Wurtzite phase. As shown in FIG. 5.2 the following coating parameter have been used: power density: 1 kW/cm², pulse time: 5 ms, nitrogen partial pressure: 0 Pa (nitrogen gas flow: 0 sccm) and argon gas flow: 300 sccm.

FIG. 5.3 shows films grown using ceramic targets. (a) Batch parameters, (b) Composition of the films at different position of the substrate holder, and (c) X-SEM micro graph and XRD plot. Annotations: S→Substrate peaks, C→Cubic peak, W→Wurtzite phase. As shown in FIG. 5.3 the following coating parameter have been used: power density: 1 kW/cm², pulse time: 5 ms, nitrogen partial pressure: 0 Pa (nitrogen gas flow: 0 sccm) and argon partial pressure: 60 Pa.

In the examples given in FIGS. 5.1, 5.2 and 5.3, the substrates to be coated were hold by using fixture systems placed in a coating machine of the type Ingenia S3p manufactured by Oerlikon Balzers. For these examples fixture systems comprising two kinds of rotatable fixture components were used. A first kind of rotatable fixture component called carrousel was placed in known manner in the middle of the coating chamber for producing a first rotation. On the carrousel, a second kind of rotatable fixture components were placed also in known manner for causing a second rotation. The substrates to be coated were hold in the second kind of rotatable fixture components. The rotation speed of the carrousel was 30 seconds pro rotation, as it is indicated in the respective FIGS. 5.1, 5.2 and 5.3. However, the kind of coating machine and fixture system being used should not be understood as a limitation of the present invention. Likewise, the coating parameters used for the examples shown in FIGS. 5.1, 5.2 and 5.3 should not be understood as a limitation of the present invention.

Figure 1:
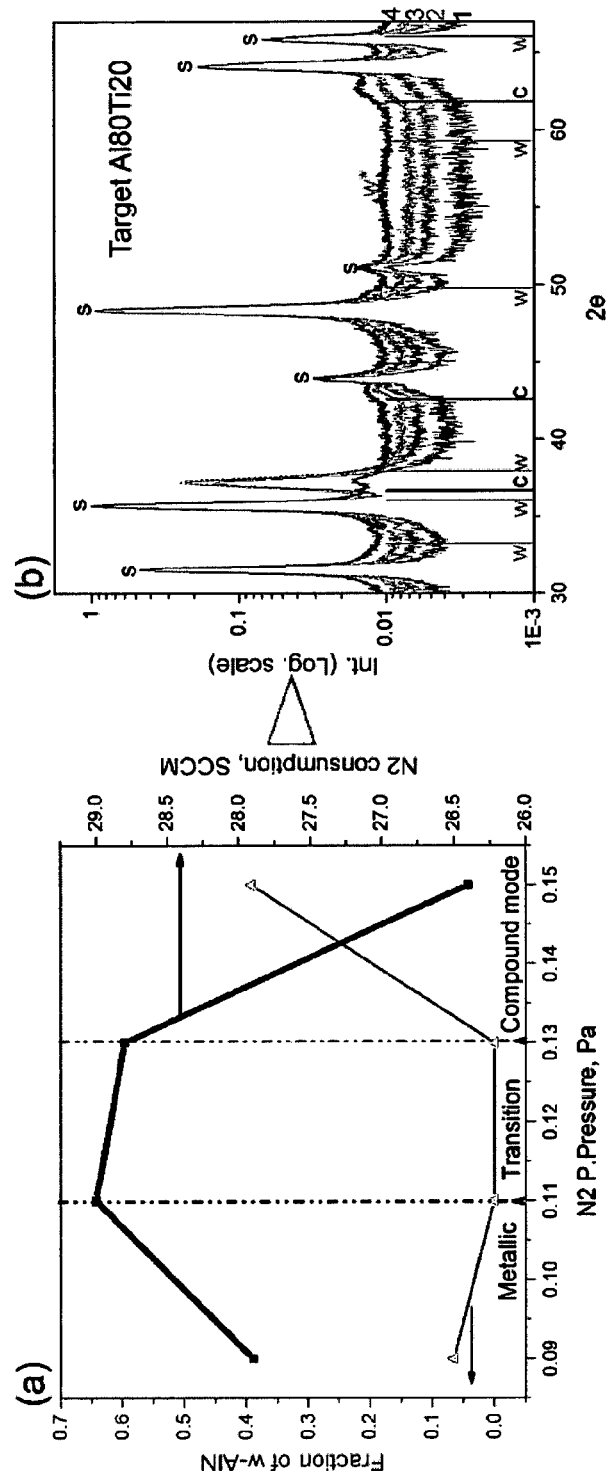
Figure 2:
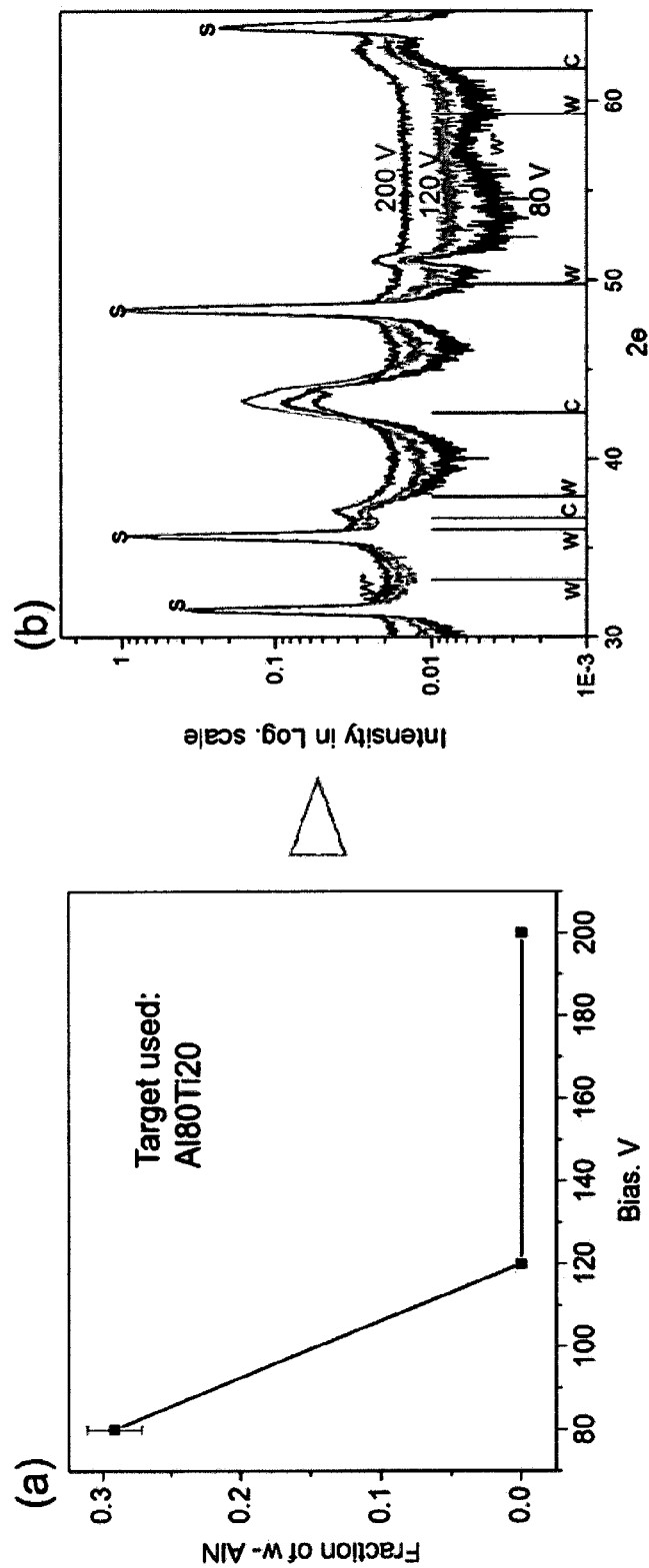
Figure 3:
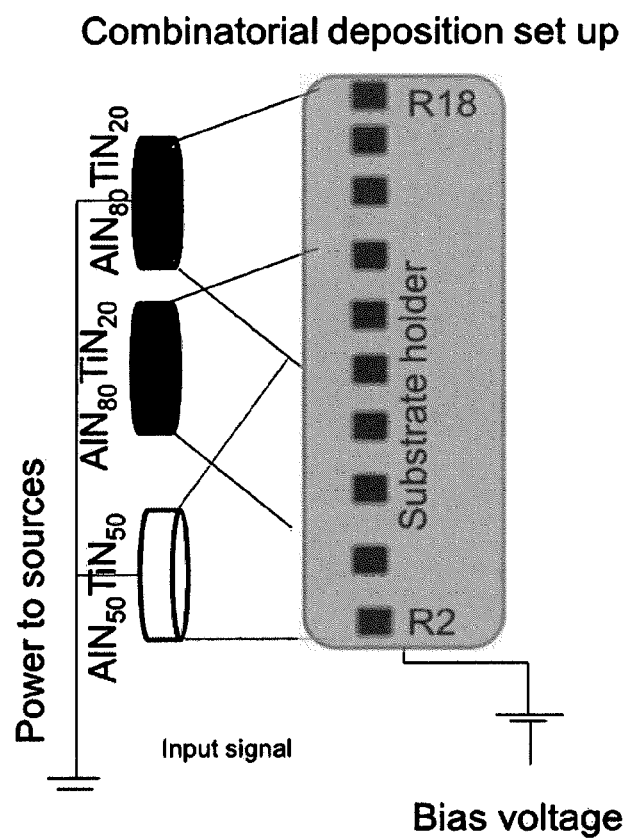
FIG. 3 shows a schematic drawing of a combinatorial deposition set-up used to grow films from the ceramic targets.
Figure 4:
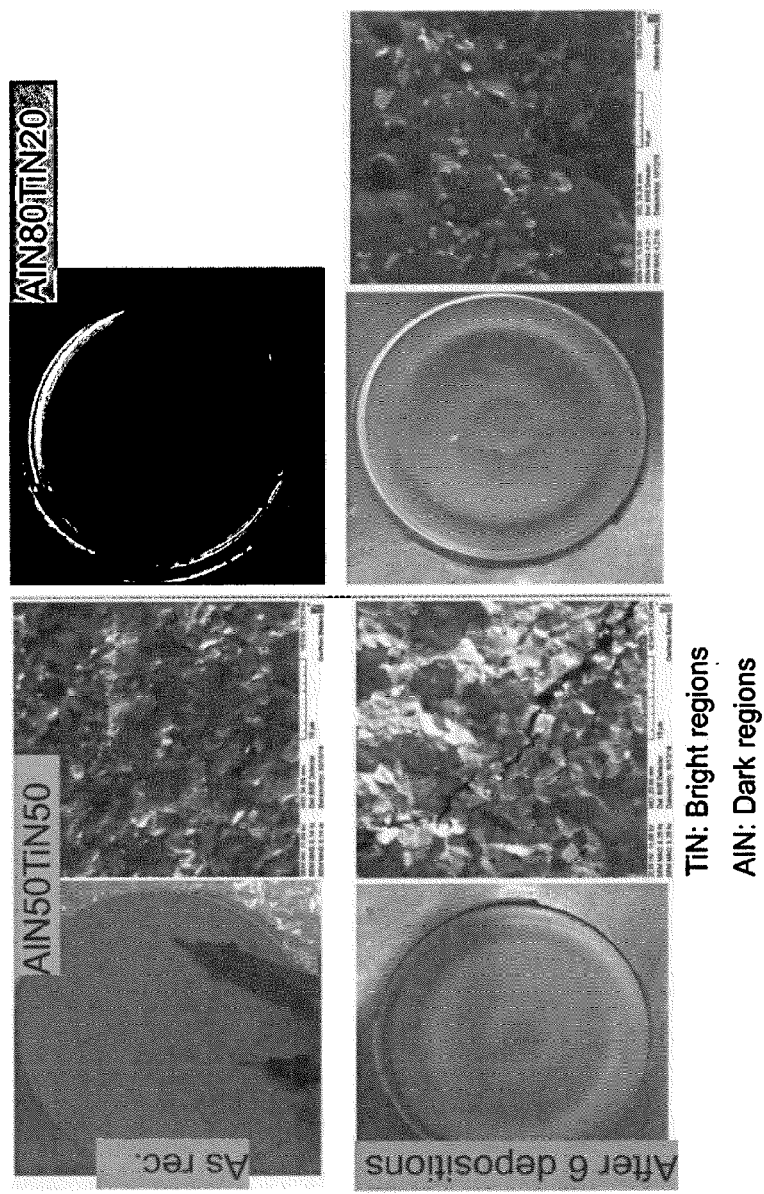
FIG. 4 shows an optical photograph and SEM micrograph of ceramic targets of TiNAlN, as received and after 6 depositions. Note that $TiN_{50}AlN_{50}$ target shows cracks, and $TiN_{20}AlN_{80}$ does not show such cracks after several process repetitions.
Figure 6:
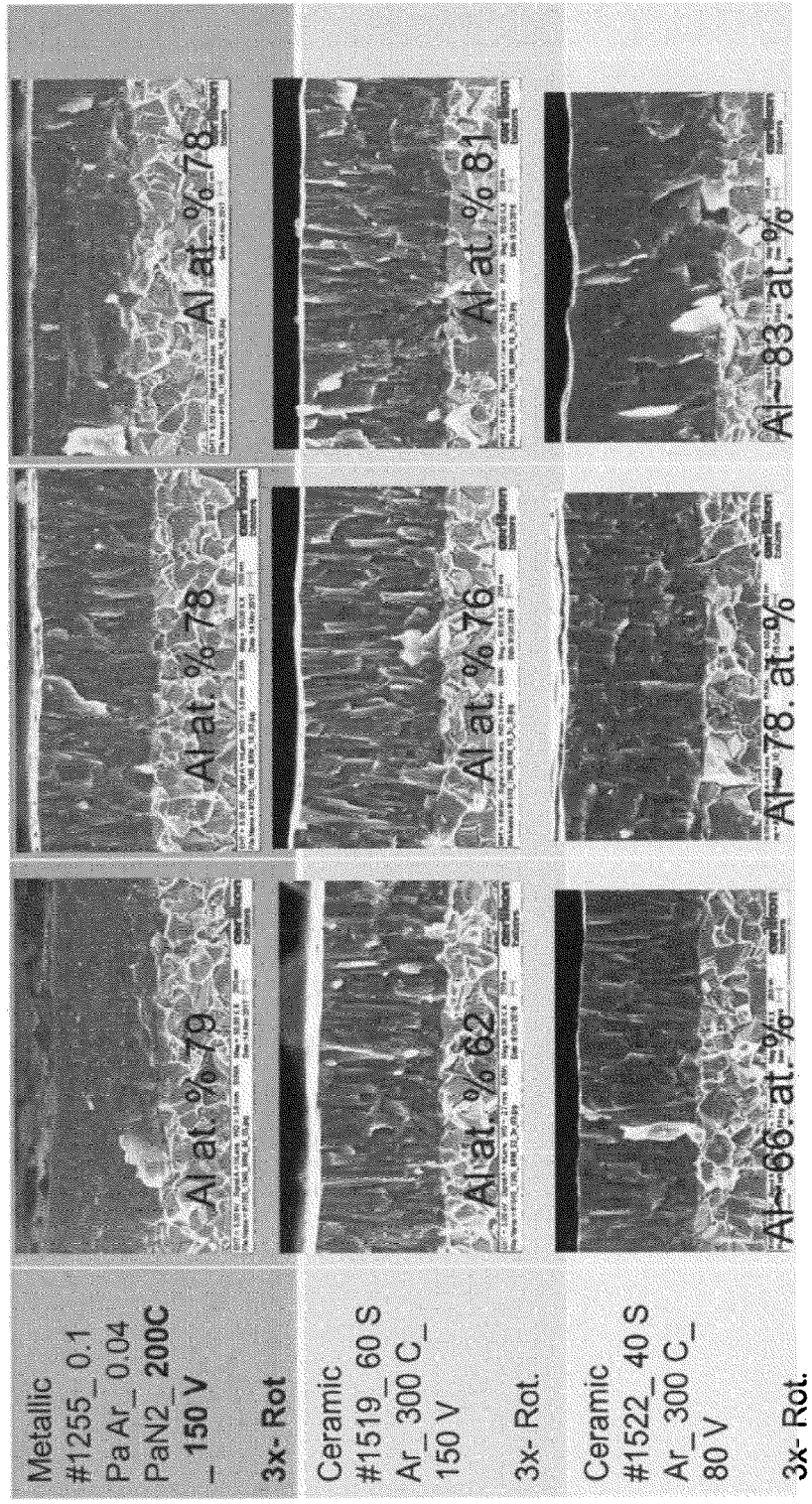

FIG. 6 shows films grown with metallic, and ceramic targets at three different conditions. As shown in FIG. 6 the used conditions of the approach in the upper row were: a mixture of 0.1 Pa Ar- and 0.04 Pa N-pressure, temperature of 200° C. and a voltage of 150 V. However, the used conditions of the approach in the middle row were: Ar gas-flow for 60 s, temperature of 300° C. and a voltage of 150 V. The used conditions of the approach in the lower row were: Ar gas-flow for 40 s, temperature of 300° C. and a voltage of 80 V. Note that with ceramic targets, cubic phase can be achieved up to Al conc. of 78 at. % using only 80 V bias. For metallic targets, a high bias of above 120 V is desired to grow cubic phase.

Micrographs from left to right: Bottom, middle, and top of the chamber.

Based on the above examples and combinatorial design experiments, a ceramic target with 77 at. % Al was chosen to test the homogeneity of the cubic phase growth along the carousel length.

Figure 7:
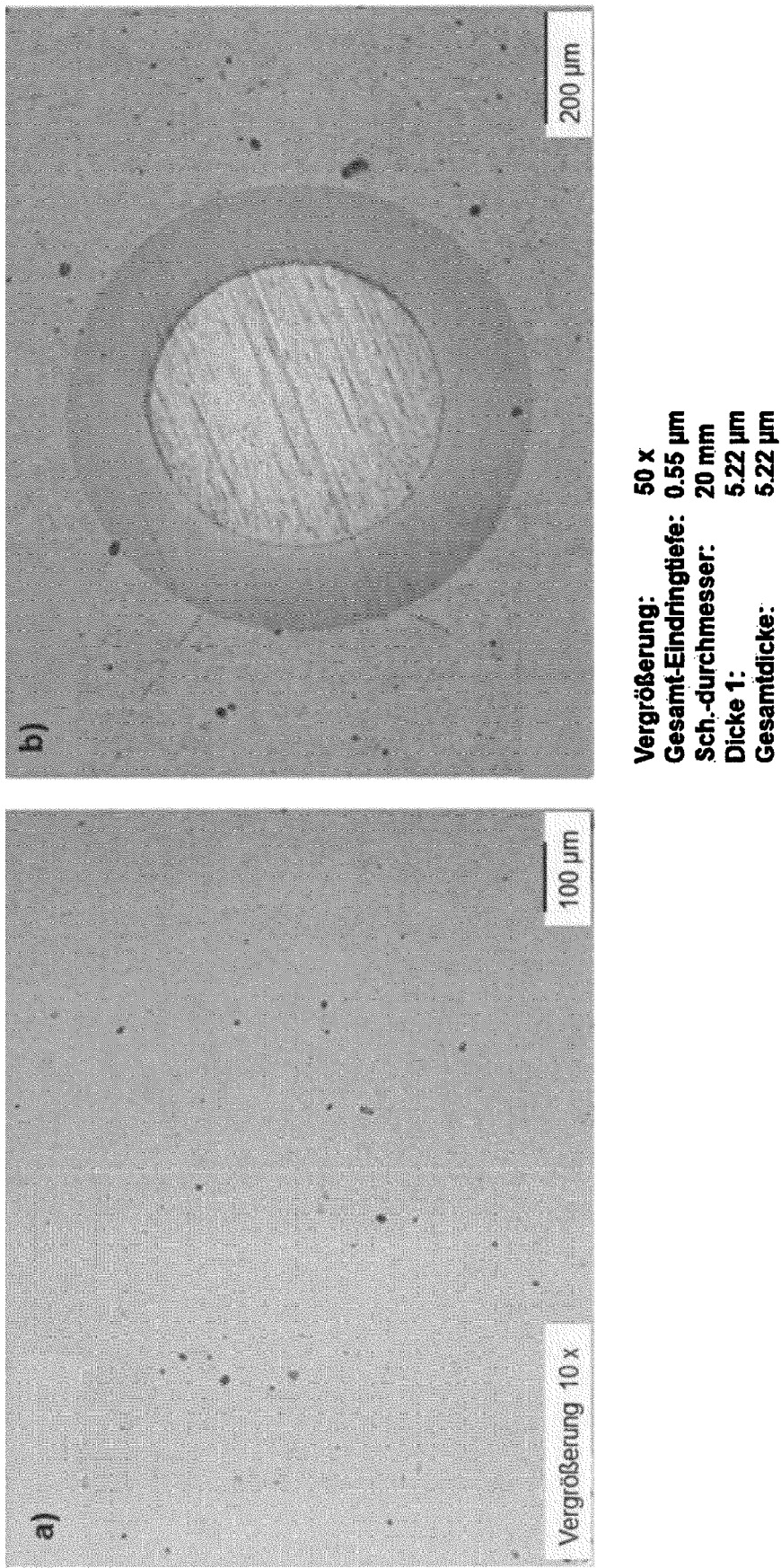
Figure 7C:
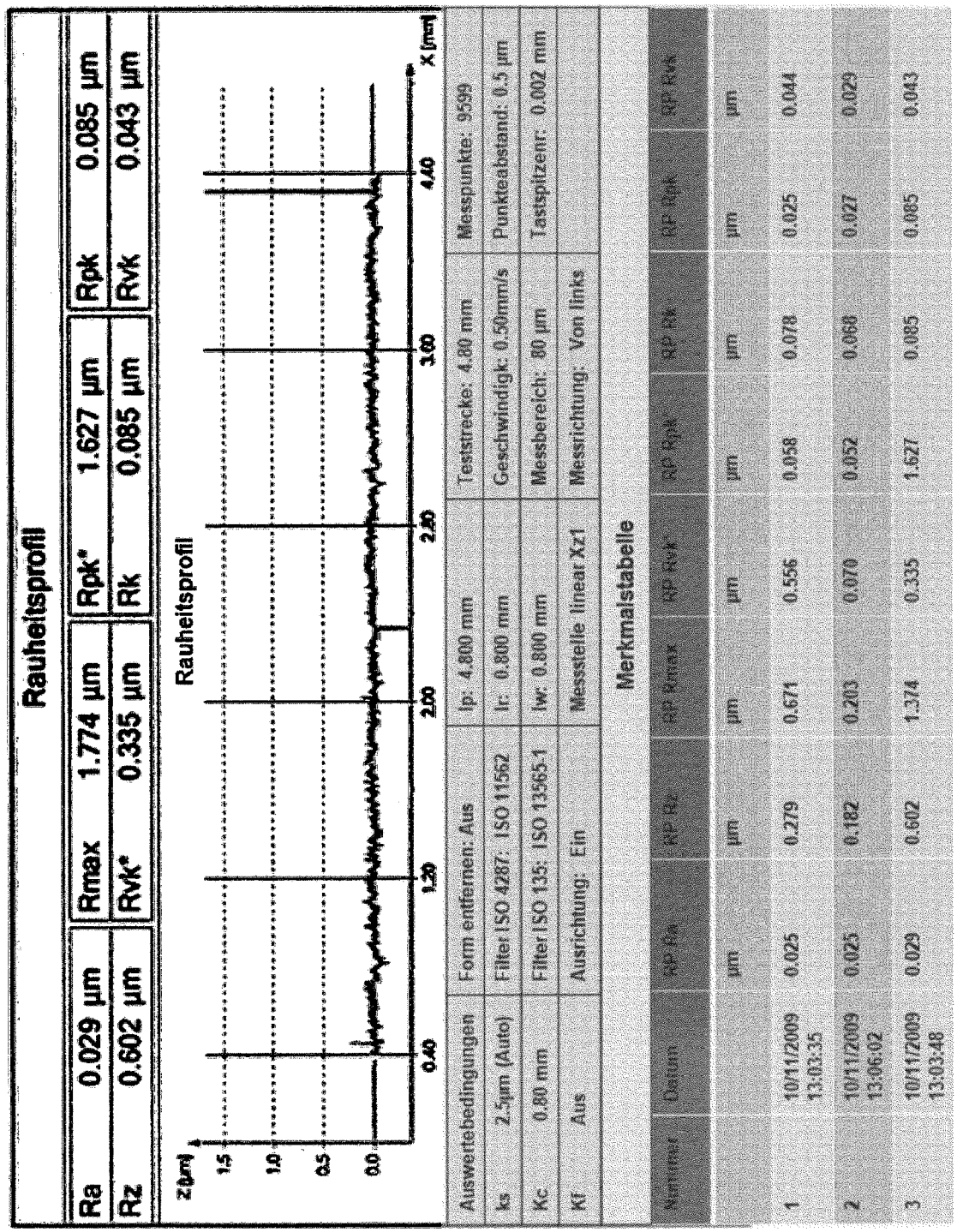

An additional feature of the coatings grown in this method is a relatively low surface roughness with a value Ra 0.03±0.01 μm and Rz 0.6±0.01 μm. FIG. 7 below shows the coating surface (a) before and after (b) calo-grinding, and (c) measured profiles of the coatings grown using the inventive method.

The invention claimed is:

1. A non-reactive PVD coating process for producing an aluminium-rich $Al_xTi_{1-x}N$-based thin film having an aluminium content of >75 at-% based on the total amount of aluminium and titanium in the thin film, a cubic crystal structure, and a columnar microstructure, wherein ceramic targets are used as a material source for the aluminium-rich $Al_xTi_{1-x}N$-based thin film.

2. The coating process according to claim 1,
   wherein the ceramic targets being formed in the form of at least nitrides or oxides or carbides.

3. The coating process according to claim 1,
   wherein a negative bias voltage is applied to the substrate to be coated, wherein the bias voltage applied to the substrate is <120 V.

4. The coating process according to claim 1,
   wherein the ceramic targets comprise Al and Ti, wherein the aluminium content, based on the total amount of aluminium and titanium in the targets is higher than 50 at-%.

5. The coating process according to claim 1,
   wherein the coating is carried out without using a reactive gas.

6. The coating process according to claim 1, wherein $AlN_{80}TiN_{20}$ is used as target material for the aluminium-rich $Al_xTi_{1-x}N$-based thin film.

7. The coating process according to claim 1,
   wherein a sputtering technique is used as a non-reactive PVD coating process.

8. The coating process according to claim 7, wherein at least an HiPIMS or an ARC PVD coating process is used as a non-reactive PVD coating process.

9. The coating process according to claim 4, wherein the ceramic targets comprise also other elements apart from Al and Ti.

10. The coating process according to claim 9, wherein the ceramic targets comprise further transition metals.

11. The coating process according to claim 1, wherein a plurality of aluminium-rich $Al_xTi_{1-x}N$-based thin films are deposited one above the other to produce a multilayer thin film.

12. The coating process according to claim 1, wherein the substrate temperature is between 100° C. and 350° C.

13. A non-reactive PVD coating process for producing an aluminium-rich $Al_xTi_{1-x}N$-based thin film having an aluminium content of >75 at-% based on the total amount of aluminium and titanium in the thin film, a cubic crystal structure, and a columnar microstructure, wherein ceramic targets are used as a material source for the aluminium-rich $Al_xTi_{1-x}N$-based thin film, wherein the substrate temperature is between 100° C. and 350° C.

* * * * *